United States Patent [19]

Jaquette

[11] Patent Number: 5,036,218
[45] Date of Patent: Jul. 30, 1991

[54] ANTISATURATION CIRCUIT

[75] Inventor: Glen A. Jaquette, Tucson, Ariz.

[73] Assignee: International Business Machines Corporation, Armonk, N.Y.

[21] Appl. No.: 496,752

[22] Filed: Mar. 21, 1990

[51] Int. Cl.$^5$ .......................................... H03K 17/60
[52] U.S. Cl. ..................................... 307/300; 307/254
[58] Field of Search ............... 307/300, 455, 456, 443, 307/458; 361/18, 58, 86, 87; 330/311

[56] References Cited

U.S. PATENT DOCUMENTS

| | | | |
|---|---|---|---|
| 4,021,687 | 5/1977 | Yoshimura | 307/300 |
| 4,338,646 | 7/1982 | Davis et al. | 361/18 |
| 4,675,548 | 6/1987 | Eshbaugh | 307/300 |
| 4,701,638 | 10/1987 | Marchio et al. | 307/300 |
| 4,710,793 | 12/1987 | Gray | 357/44 |
| 4,755,741 | 7/1988 | Nelson | 323/289 |
| 4,764,686 | 8/1988 | Rischmuller | 307/300 |
| 4,914,320 | 4/1990 | Zhang | 307/443 |
| 4,980,578 | 12/1990 | Shaffer et al. | 307/300 |
| 4,988,899 | 1/1991 | Jansson | 307/300 |

Primary Examiner—Stanley D. Miller
Assistant Examiner—Toan Tran
Attorney, Agent, or Firm—F. E. Anderson

[57] ABSTRACT

An antisaturation circuit comprising a differential input pair monitors the collector-base voltage of a protected transistor to detect the condition prior to the protected transistor going into saturation mode. To prevent the protected transistor from operating in the saturation mode, the differential input pair sinks a portion of the protected transistor's collector current. This reduction in collector current causes an increase in the collector voltage thus keeping the collector-base junction reverse biased and the protected transistor out of the saturation mode. This antisaturation technique does not steal base current from the protected transistor, hence leaving its input impedance unaffected. This antisaturation technique is thus useful in higher performance non-linear circuits as well as in linear circuits.

14 Claims, 2 Drawing Sheets

ANTISATURATION CIRCUIT

FIELD OF THE INVENTION

This invention relates generally to the field of electronic circuits and more particularly, to electronic circuits having antisaturation protection.

BACKGROUND OF THE INVENTION

Bipolar transistors exhibit the characteristics of a switch when driven to the extreme conditions of cut-off and saturation mode. The advantages of driving a transistor into saturation mode include a low voltage across collector and emitter inputs known as a saturation voltage ($V_{CESAT}$), and a low collector-emitter resistance, which provides for optimum efficiency. As the transistor is driven still further into saturation mode or into deep saturation, the saturation voltage increases with collector current ($I_C$), due mainly to collector resistance, and efficiency decreases due to the resulting power dissipation which is a function of a collector-emitter voltage ($V_{CE}$) times $I_C$.

In addition to the decrease in efficiency, a bipolar transistor driven into deep saturation causes minority carriers from its collector to be injected into its base. As a result, the turn off time of the transistor is adversely affected and becomes a function of the transistor's storage time ($t_s$) since the minority carriers must be swept out of the base before the transistor is turned off. Switching speed of bipolar transistors is a major advantage and numerous techniques have been employed to keep transistors out of saturation mode and/or deep saturation mode for improved turn off times.

A common antisaturation technique comprises shunting a collector-base junction of a NPN transistor with a Schottky diode. In order for a transistor to operate in saturation mode, both the base-emitter and collector-base junctions must be forward biased. The Schottky diode exhibits a lower forward voltage ($V_F$) than the forward biased collector-base junction and thus clamps the junction at the lower voltage, therein preventing the transistor from operating in the saturation mode. Excess base current is fed to the collector of the transistor by the Schottky diode which decreases the effective efficiency of the transistor. The $V_F$ of the Schottky diode changes with temperature at a rate equal to approximately one half the rate of change of the transistor's collector-base voltage with temperature. This method, therefore, losses its effectiveness at high temperatures. An antisaturation technique similar to using the Schottky diode but improving on the temperature tracking problem is described in Eshbaugh, U.S. Pat. No. 4,675,548. Here the collector-base junction of the transistor which is to be kept from operating in the saturation mode is shunted by a collector-emitter junction of a second transistor to limit the collector-base voltage of the saturation protected transistor. Like the Schottky diode solution, this technique steers excess base current of the protected transistor to its collector and is not suitable for many analog applications.

Another antisaturation technique using a parasitic lateral PNP transistor is taught in Yoshimura, U.S. Pat. No. 4,021,687. The lateral PNP transistor turns on before the saturation protected NPN transistor goes into the deep saturation mode and steers excess base current through a third transistor. This technique, while preventing the transistor from going into the deep saturation mode, still allows the protected transistor to go into the saturation mode and further steals base current from the protected transistor which may adversely affect its input impedance. Thus what is needed is an antisaturation circuit useful in analog applications, which senses a protected transistor's collector-base voltage to keep it out of saturation by modifying its collector current accordingly without stealing its base current and thus changing the input impedance of the device.

SUMMARY OF THE INVENTION

Accordingly, it is an object of the present invention to provide an improved antisaturation circuit that keeps a transistor out of saturation without stealing its base current.

It is further an object of the present invention to provide an antisaturation circuit that is useful for analog applications.

Yet another object of the present invention is to provide an antisaturation circuit that monitors the voltage of the transistor to be protected.

These and other objects of this invention are accomplished by employing a detecting circuit having first and second inputs coupled to first and second inputs of a protected transistor to be kept out of saturation mode and monitoring a voltage of the protected transistor that is indicative of an on-coming saturation mode. A first current source is coupled to the detecting circuit for supplying a constant current thereto. A second current source is coupled to both the detecting circuit and the protected transistor which allows a portion of a current, other than the base current, of the protected transistor to be diverted to the detecting circuit according to the monitored voltage to ensure the protected transistor does not operate in the saturation mode.

The foregoing and other object, features and advantages of the invention will be apparent from the following more particular description of preferred embodiment of the invention, as illustrated in the accompanying drawings.

DETAILED DESCRIPTION

Figure 1:
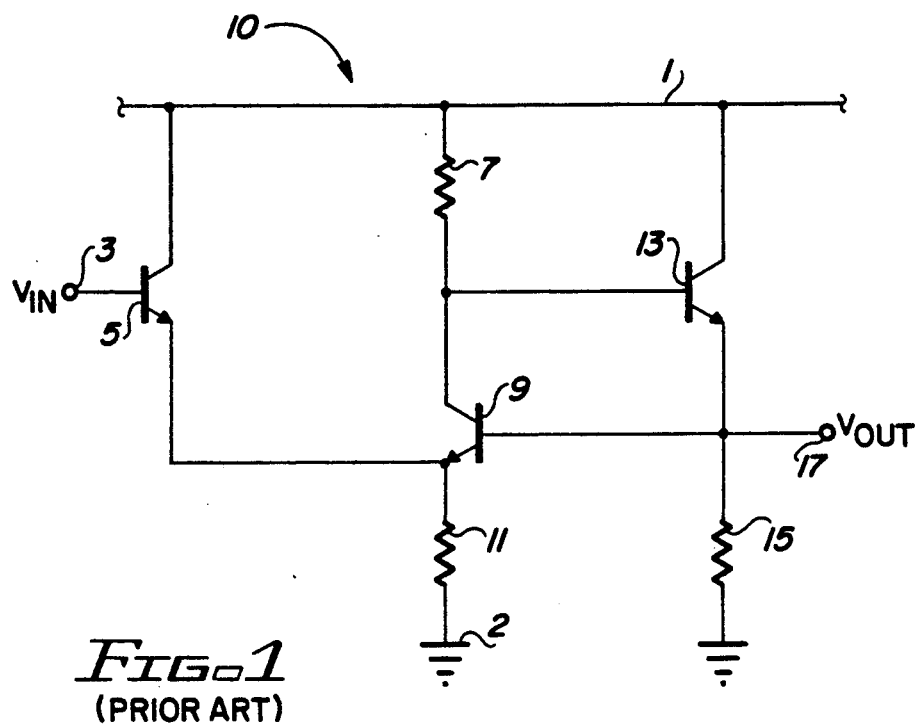
FIG. 1 is a schematic representation of a prior art unity gain buffer circuit.

A unity gain buffer circuit 10 useful for low frequency applications and having a limited voltage range is shown in FIG. 1. A transistor 9 of the unity gain buffer circuit 10 will typically switch into and out of saturation mode when used in non-linear applications or when a slew rate of an input voltage is too fast. When the transistor 9 goes into saturation mode, its turn-off time increases, thus causing the unity gain buffer circuit 10 to require additional time to settle (settling time) after a fast slew. Moreover, a response time (and hence the effective bandwidth) is degraded when used in non-linear applications. Saturation mode operation of the transistor 9 also creates an undesirable offset from an input terminal 3 to an output terminal 17. The offset is a difference in magnitude between the input voltage and an output voltage. If the transistor 9 is prevented from operating in the saturation mode, both the settling time and effective bandwidth of the unity gain buffer 10 could be improved making it useful in higher performance applications.

Figure 2:
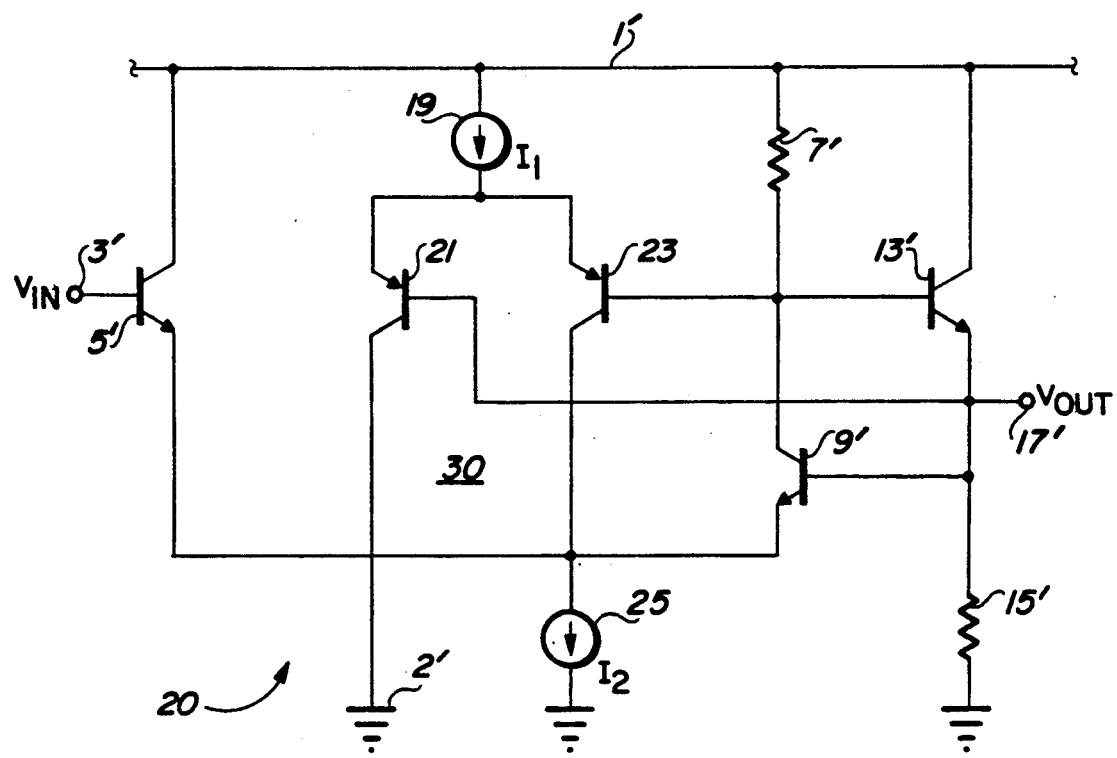
FIG. 2 is a schematic representation of a voltage buffer having an improved antisaturation circuit.

A voltage buffer circuit 20, shown in FIG. 2, is made up of a unity gain buffer circuit similar to the unity gain buffer circuit 10 shown in FIG. 1 and an antisaturation circuit 30. Devices similar to those used in FIG. 1 and repeated in FIG. 2 are represented by primed numbers. The voltage buffer circuit 20 includes an input transistor 5' having a base connected to an input terminal 3', its collector input connected to a supply voltage terminal 1', and its emitter input connected to an emitter input of a transistor 9'. The transistor 9' has its collector input coupled to the supply voltage terminal 1' through a resistor 7' for receiving a positive supply voltage, and its base input coupled to a supply voltage terminal 2' through a resistor 15'. An output transistor 13' has its collector input connected to the supply voltage terminal 1', its base input connected to the collector input of the transistor 9', and its emitter input connected to an output terminal 17' and to the base input of the transistor 9'. The resistor 7', the transistor 13', and the resistor 15' provide the output driving function for the voltage buffer circuit 20.

The antisaturation circuit 30 includes transistors 21 and 23 having their emitter inputs coupled to the supply voltage terminal 1' by a current source 19, and their base inputs forming first and second inputs, respectively, of the antisaturation circuit, are connected to the base and collector inputs, respectively, of the transistor 9'. A collector input of the transistor 21 is connected to the supply voltage terminal 2'. A collector input of the transistor 23 is connected to the emitter input of the transistor 9' and the supply voltage terminal 2' by a current source 25. The transistors 21 and 23 form an emitter-coupled pair or a detecting circuit which is used to monitor and amplify a collector-base voltage of the transistor 9'. If a collector-base junction of the transistor 9' becomes forward biased, the transistor 9' would go into the saturation mode. The antisaturation circuit 30 prevents this from occurring as described below.

When an input voltage ($V_{IN}$) at the input terminal 3' is in a steady-state, the voltage buffer circuit 20 operates so that an output voltage ($V_{OUT}$) at the output terminal 17' is substantially equal to $V_{IN}$ plus an offset voltage. The offset voltage is the difference between $V_{IN}$ and $V_{OUT}$ and is the result of different biases and base-emitter voltages ($V_{BE}$) of the transistors 5' and 9'. In an equilibrium state, the transistor 13' is biased in a conducting state and the magnitude of the voltage at the bases of the transistors 13' and 23 is substantially equal to the magnitude of the voltage at the bases of the transistors 9' and 21 plus a $V_{BE}$. As a result, the transistor 23 is in an off state.

Figure 3:
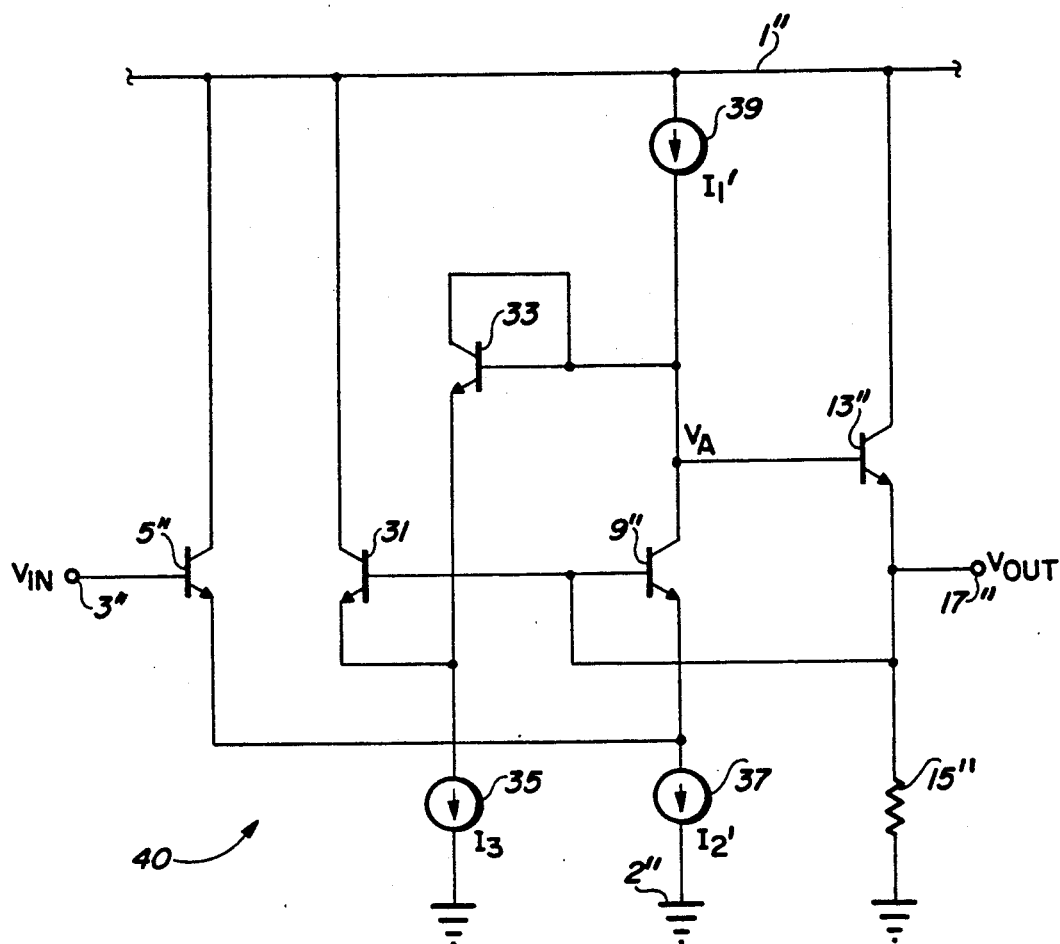
FIG. 3 is a schematic representation of second embodiment of a voltage buffer having an improved antisaturation circuit.

If $V_{IN}$ were to suddenly transition negatively, the buffer circuit 20 would not be able to track the change instantaneously due to slew rate limiting factors such as parasitic capacitances of the transistors 9' and 13', any external load capacitance at the output terminal 17', and the limited bandwidth of all the transistors. Moreover, the transistor 5' will be in an off state and the transistor 9' will conduct more current until the output voltage $V_{OUT}$ can slew to within 3 $V_T$ of $V_{IN}$, wherein $V_T$ is 25.8 millivolts at room temperature. The resistor 7' will carry the additional current that the transistor 9' conducts causing the magnitude of the voltage at the bases of the transistors 13' and 23 to decrease, thereby turning off the transistor 13'. The transistor 9' approaches the saturation mode as the voltage at its collector approaches the voltage at its base. However, saturation mode is avoided because the transistor 23 begins to conduct a portion of a current $I_1$ from the current source 19 into the emitter of the transistor 9' which essentially reduces the emitter and collector current bias of the transistor 9'. Thereafter a new equilibrium is reached wherein the antisaturation circuit 30 acts to adjust the current bias of the transistor 9' such that the saturation mode is avoided. In the buffer circuit 20, when the transistors 21 and 23 are matched, the current $I_1$ is greater than or equal to a current $I_2$ from the current source 25 and the $V_{CESAT}$ of the transistor 9' is less than $V_{BE} - 4 V_T$, where $V_{BE}$ is the base-emitter voltage. The transistor 9' is thus protected from going into saturation mode without stealing its base current therein making the antisaturation circuit 30 useful for both linear and non-linear operations. An alternative embodiment such as voltage buffer circuit 40, is shown in FIG. 3. Numbers used in FIG. 1 are repeated in FIG. 3 with double primes to represent like devices. The voltage buffer circuit 40 includes an input transistor 5" having a collector input connected to a supply voltage terminal 1", a base input connected to an input terminal 3" for receiving an input voltage, $V_{IN}$, and an emitter input coupled to a supply voltage terminal 2" by a current source 37. A transistor 33, connected to function as a diode, has collector and base inputs coupled to the supply voltage terminal 1" by a current source 39, and its emitter input coupled to the supply voltage terminal 2" by a current source 35. A transistor 31 has its collector input connected to the supply voltage terminal 1", its base input connected to an output terminal 17", and its emitter input coupled to the supply voltage terminal 2" by the current source 35. Transistor 9" is the transistor that is protected from going into the saturation mode. The speed of the voltage buffer circuit 40 is increased because transistor 9" is kept in a forward linear region of operation at all times. Transistor 9" has its collector input connected to the collector input of the transistor 33, its base input connected to the output terminal 17", and its emitter input coupled to the supply voltage terminal 2" by the current source 37. Transistor 13" has its collector input connected to the supply voltage terminal 1", its base input connected to the collector of the transistor 9", and its emitter input connected to the output terminal 17" and the supply voltage terminal 2" by a resistor 15". The transistor 13", the resistor 15", and the current source 39 provide the output driving function for the voltage buffer circuit 40. The transistors 31, and 33, in combination with the current source 35, form a differential amplifier or a detecting circuit with the bases providing first and second inputs, respectively, wherein the sum of the currents flowing through the transistors 31 and 33 equals a current $I_3$ flowing in the current source 35. A current $I_2'$ flowing in the current source 37 is set, for example, substantially equal to $I_3$, and a current $I_1'$ flowing in the current source 39 is set to substantially equal 1.5 times $I_2'$. In general, the transistors 5" and 9" are matched transistors, and the current $I_1'$ is set to be less than the sum of the currents $I_2'$ and $I_3$. In an equilibrium condition, the magnitude of $V_{IN}$ is substantially equal to the magnitude of $V_{OUT}$ and the sum of the currents flowing through the transistors 5" and 9" is substantially equal to $I_2'$. When $V_{OUT}$ exceeds $V_{IN}$, the current flowing in the transistor 9" begins to increase above $I_2'/2$ causing its collector voltage ($V_A$) to decrease towards $V_{OUT}$. This decrease causes the current in the transistor 31 to increase and the current in the transistor 33 to decrease until equilibrium is reached thus circumventing the saturation mode of operation of the transistor 9".

When $V_{IN}$ exceeds $V_{OUT}$, the current flowing in the transistor 5" increases causing the current in the transistor 9" to decrease below $I_2'/2$ due to the action of the current source 37. This causes $V_A$ to increase, such that the current flowing in the transistor 13" increases as a function of the difference in magnitude between $V_A$ and $V_{OUT}$ (collector-base voltage of the transistor 9"), and $V_{OUT}$ to increase, thus keeping the offset minimized and keeping the transistor 9" in the conducting state. By maintaining the transistor 9" in its linear operating region, the speed of operation of the voltage buffer 40 increases while minimizing the offset.

Figure 4:
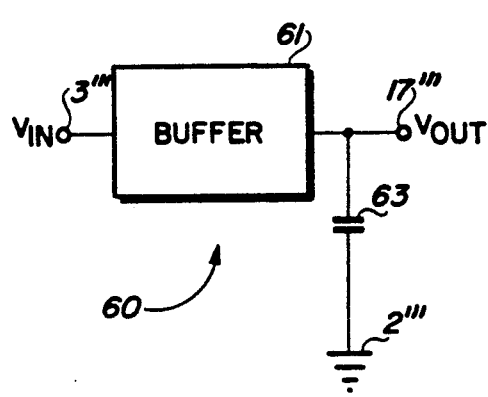
FIG. 4 is a block diagram of a peak follower comprising a voltage buffer circuit.

The voltage buffer circuit 20 (FIG. 2), and the voltage buffer circuit 40 may be used in a variety of applications. An example of using the voltage buffer circuits 20 and 40 as a peak follower 60 is shown in FIG. 4. A voltage buffer 61 has an input terminal 3''' connected for receiving an input voltage, $V_{IN}$, and an output terminal 17''' connected for providing an output voltage, $V_{OUT}$. The voltage buffer 61 is equivalent to either the voltage buffer circuit 20 or the voltage buffer circuit 40, each of which have the resistor 15' or 15", respectively, replaced by a capacitor 63. The voltage buffer circuit 61 is able to function as a peak detector because a base current of the respective transistor 9' or 9" is the only current available to discharge the capacitor 63 once it is charged and, as already described, the base current of the transistor 9' or 9" is not changed substantially when keeping the transistor 9' or 9" out of the saturation mode.

Figure 5:
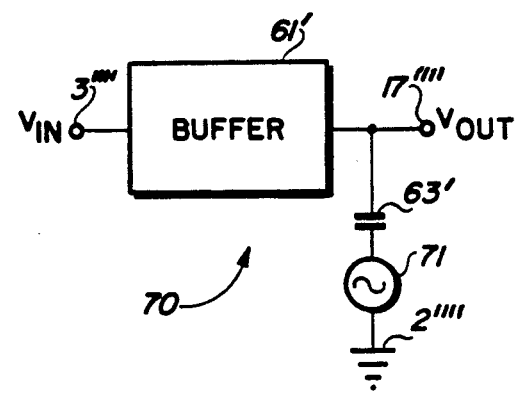
FIG. 5 is a block diagram of a DC restore circuit comprising a voltage buffer circuit.

A DC restore circuit 70 is shown in FIG. 5. The restore circuit 70 is similar to the peak follower 60 with the exception that $V_{IN}$ performs the function of a bias voltage, and an AC signal source 71 is coupled between the supply voltage terminal 2'''' and a capacitor 63' for providing an AC signal. The AC signal drives the output voltage, $V_{OUT}$, through the capacitor 63'. $V_{OUT}$ will equal the value of the AC signal plus a DC component. The most negative magnitude of $V_{OUT}$ will substantially equal the bias voltage $V_{IN}$. The performance of both linear and non-linear circuits may be substantially improved by the use of antisaturation circuits as described herein. This technique protects a transistor from operating in both the deep saturation mode and the saturation mode. The antisaturation circuit accomplishes antisaturation protection by monitoring the protected transistor's collector-base voltage and thus uses voltage feedback to signify the potential of saturation mode operation. When the oncoming saturation mode is detected, the collector current of the protected transistor is reduced thus keeping the protected transistor from saturating. Reducing the collector current based on the collector-base voltage of the protected transistor rather than using the typical techniques of steering the base current into the collector has the advantage of keeping the protected transistors input impedance substantially unchanged.

While the invention has been particularly described with reference to particular embodiments thereof, it will be understood by those skilled in the art that various other changes in detail may be made therein without departing from the spirit, scope, and teaching of the invention. For example, the resistor 7' or 7" of FIG. 2 or 3, respectively, could be replaced by a current source similar to the current source 19 to improve accuracy of the circuit. The current source 39 of FIG. 3 could be replaced by a resistor in order to reduce the number of devices. Likewise, current mirrors could be used in the collectors or emitters of the active devices to improve the circuit's performance. Furthermore, base resistors may be inserted at the bases of the transistor to reduce the possibility of unwanted circuit oscillations.

Accordingly, the invention herein disclosed is to be limited only as specified in the following claims.

What is claimed is:

1. An antisaturation circuit for controlling a protected transistor, said antisaturation circuit comprising:
   detecting means having a first input coupled to a first input of said protected transistor and a second input coupled to a second input of said protected transistor for monitoring a voltage therebetween;
   first current source coupled to said detecting means for providing a first substantially constant current to said detecting means; and
   second current source coupled to said detecting means and said protected transistor for providing a second substantially constant current thereto, wherein the second substantially constant current is apportioned between said detecting means and said protected transistor according to the detected voltage to prevent said protected transistor from operating in a saturation mode.

2. The antisaturation circuit according to claim 1 wherein said detecting means further comprises:
   a first transistor having a base coupled to the first input of said protected transistor, an emitter coupled to said first current source, and a collector coupled for receiving a supply voltage; and
   a second transistor having a base coupled to the second input of said protected transistor, an emitter coupled to the emitter of said first transistor, and a collector coupled to said second current source.

3. The antisaturation circuit according to claim 2 wherein the first input of said protected transistor is a base, and the second input of said protected transistor is a collector.

4. The antisaturation circuit according to claim 3 wherein said protected transistor has an emitter coupled to the collector of said second transistor.

5. The antisaturation circuit according to claim 3 wherein the collector of said protected transistor is coupled to the collector of said second transistor.

6. The antisaturation circuit according to claim 3 further comprising a third transistor having a base coupled to the collector of said protected transistor, and an emitter coupled to the base of said protected transistor.

7. A high performance buffer circuit having a driver transistor protected from operating in the saturation mode, said buffer circuit comprising:
   input means coupled for receiving an input voltage;
   output means coupled to said input means and to said driver transistor for providing an output voltage substantially equal to said input voltage; and
   antisaturation means coupled to said driver transistor for monitoring a voltage therefrom and when said voltage reaches a predetermined magnitude, reducing a collector current in said driver transistor without substantially affecting a base current in said driver transistor before said driver transistor can operate in the saturation mode.

8. The buffer circuit according to claim 7 wherein said input means comprises a first transistor having a collector coupled for receiving a first supply voltage, a base coupled for receiving the input voltage, and an emitter coupled to an emitter of said driver transistor.

9. The buffer circuit according to claim 8 wherein said output means comprises:
    an output transistor having a collector coupled for receiving the first supply voltage, a base coupled to a collector of said driver transistor and an emitter coupled to the base of said driver transistor;
    a resistor having a first end coupled to the base of said output transistor and a second end coupled for receiving the first supply voltage; and
    passive element means having a first end coupled to the emitter of said output transistor and a second end coupled for receiving a second supply voltage for biasing the output transistor.

10. The buffer circuit according to claim 9 wherein said antisaturation means comprises:
    first current source for providing a first substantially constant current having a first node coupled for receiving the first supply voltage, and having a second node;
    detecting means coupled to the second node of said first current means and having first and second inputs coupled to the collector and base, respectively, of said driver transistor for monitoring and amplifying said voltage from said driver transistor and reducing the collector current in said driver transistor when the magnitude of said voltage reaches a predetermined magnitude; and
    second current source having a first node coupled to said detecting means and to the emitter of said driver transistor and a second node coupled for receiving the second supply voltage for maintaining a second substantially constant current therefrom.

11. The buffer circuit according to claim 9 wherein said antisaturation means comprises:
    current source for providing a first substantially constant current having a first node coupled for receiving a second supply voltage and having a second node; and
    detecting means coupled to the second node of said current means and having first and second inputs coupled coupled to the collector and base, respectively, of said driver transistor for monitoring and amplifying said voltage and reducing the collector current when the magnitude of said voltage reaches a predetermined magnitude.

12. The buffer circuit according to claim 9 wherein said passive element means is a resistor.

13. The buffer circuit according to claim 9 wherein said passive element means is a capacitor.

14. The buffer circuit according to claim 13 wherein said output means further comprises an AC signal source coupled between said capacitor and the second supply voltage.

* * * * *